United States Patent

Faragi

[11] Patent Number: 5,971,771
[45] Date of Patent: Oct. 26, 1999

[54] COMPONENT TO SUBSTRATE CONNECTION AND DISPLAY ASSEMBLY USING SAME

[76] Inventor: Eric Joseph Faragi, 4501 Roxbury Ct., Boynton Beach, Fla. 33462

[21] Appl. No.: 09/054,812

[22] Filed: Apr. 3, 1998

[51] Int. Cl.⁶ ................................................ H01R 4/58
[52] U.S. Cl. ............................................. 439/66; 439/91
[58] Field of Search .......................... 439/66, 91, 378, 439/482, 86; 349/58, 89, 60

[56] References Cited

U.S. PATENT DOCUMENTS

| | | | |
|---|---|---|---|
| 5,092,774 | 3/1992 | Milan | 439/66 |
| 5,371,654 | 12/1994 | Beaman et al. | 439/91 |
| 5,434,452 | 7/1995 | Higgins | 439/91 |
| 5,466,161 | 11/1995 | Yumibe et al. | 439/66 |
| 5,495,393 | 2/1996 | Yoneda et al. | 439/91 |

Primary Examiner—Michael L. Gellner
Assistant Examiner—Antoine Ngandjui
Attorney, Agent, or Firm—Philip P. Macnak; John H. Moore

[57] ABSTRACT

An electrical connection is formed between conductors (46, 48) on a substrate (36), and pads (42, 44) that are coupled to an electrical component. The conductive pads (42, 44) are arranged in two rows of oversize pads. Two corresponding rows of undersize conductors (46, 48) are electrically connected to the pads by a conductive elastomer (40). A display assembly (26) advantageously employs the electrical connection.

14 Claims, 5 Drawing Sheets

COMPONENT TO SUBSTRATE CONNECTION AND DISPLAY ASSEMBLY USING SAME

CROSS REFERENCE TO RELATED APPLICATION

This Application is related to U.S. application Ser. No. 08/958,232 filed Oct. 27, 1997, entitled "Method and Apparatus for Elastomer Connection Between a Bonding Shelf and a Substrate".

FIELD OF THE INVENTION

This invention relates to apparatus for forming an electrical connection between bonding pads or the like on an electrical component and electrical conductors on a substrate.

BACKGROUND OF THE INVENTION

Making electrical connections between conductive pads on an electrical component and the conductors on a substrate such as a PCB (Printed Circuit Board) in a high volume manufacturing process typically requires consideration of factors such as: the pitch of the pads on the electrical component, the pitch of the conductors on the PCB and the means of attachment between the PCB and the electrical component.

In the past, when the pitch of the pads and conductors was large enough, elastomer conductors could be used to electrically connect the pads on the electrical component to the conductors on the PCB. However, more recent alignment requirements of pads with smaller pitches (less than 50 mils) have made the use of elastomer connectors impractical. Thus, only a HSC (Heat Seal Connector) or a TAB(Tape Automating Bonding) type connection has been considered practical for satisfying the more stringent requirements.

FIG. 1 illustrates the use of an HSC for electrically connecting conductive runners 10 on a LCD (Liquid Crystal Display) panel 12 to conductive pads 14 on a PCB 16. The pads 14 are coupled to electrical parts (not shown) on the PCB 16 via conductive runners 18.

An HSC 20 is used as the connecting mechanism. The illustrated HSC 20 has conductive runners 22 bonded by heat sealing to the runners 10 on the LCD panel 12, and runners 24 bonded to the pads 14 on the PCB 16.

It would be preferable if an elastomer connector could be used in place of the HSC 20 to connect the LCD panel to the PCB 16, particularly in applications where the LCD panel 12 is used in a front mount display product such as a pager, but the small pitch (and high pin count) would cause alignment problems as discussed previously.

DESCRIPTION OF THE PREFERRED EMBODIMENT

Figure 2:
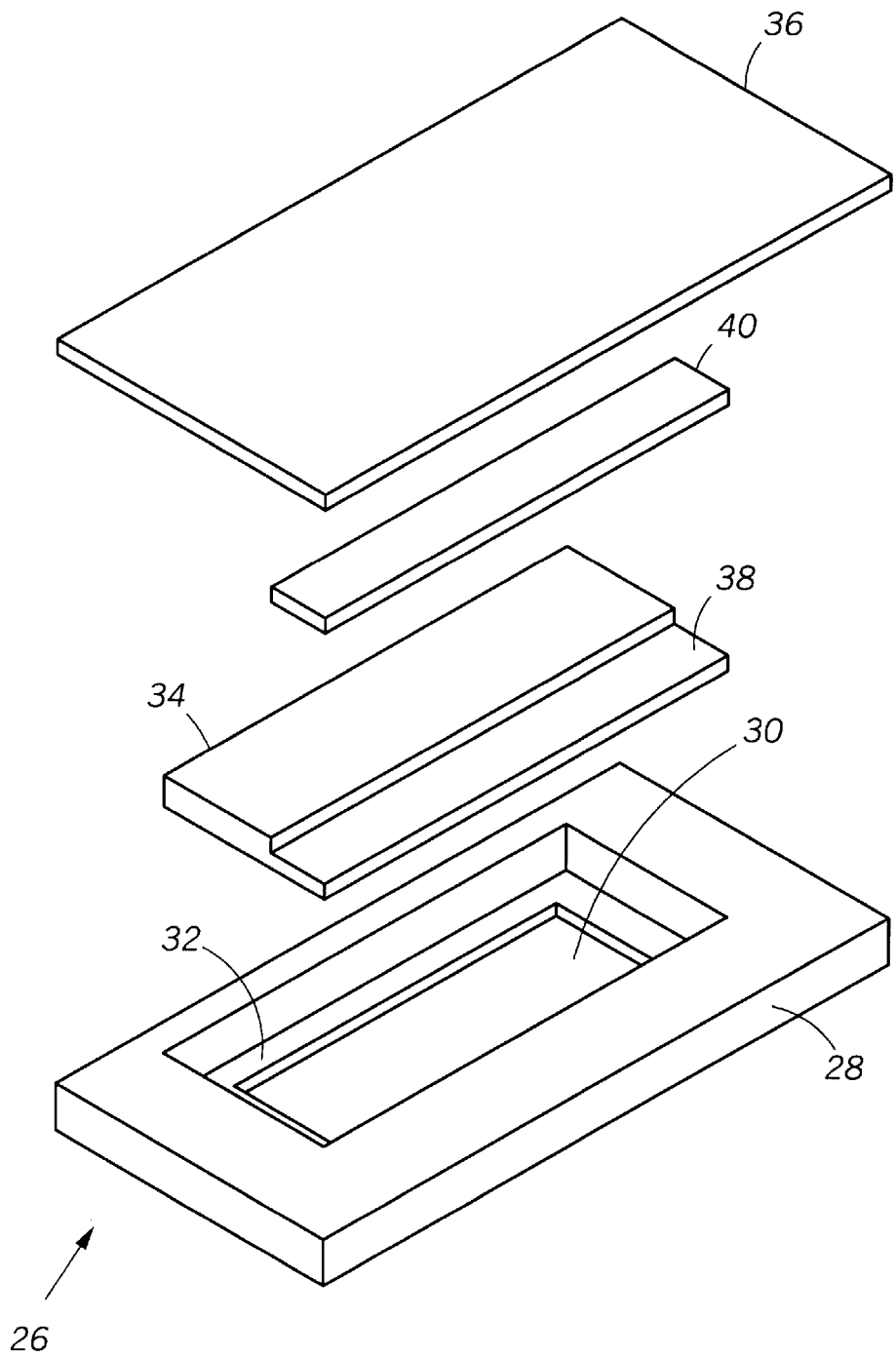
FIG. 2 is an exploded view of a display assembly that is constructed according to the invention.

Referring to FIG. 2, a display assembly 26 which is constructed in accordance with the invention includes a chassis 28 having a central opening 30 and an interior ledge 32. A LCD 34 rests on the ledge 32 and is held securely within the chassis 28. The LCD 34 has a viewing surface that faces downwardly in FIG. 2 so that a user can see images on it through the opening 30.

The LCD 34 is driven by electronic circuitry (not shown) that is mounted on a substrate 36 which may be a PCB. Electrical connections between that electronic circuitry and the LCD are made via pads (not shown in FIG. 2) situated on a bonding shelf 38 and conductors (also not shown in FIG. 2) situated near an edge of the substrate 36. An electrical connection between those conductors on the substrate 36 and the pads on the LCD is made by a conductive elastomer 40. The elastomer 40 sits on the bonding shelf 38, with the substrate 36 held securely against the conductive elastomer 40 and the upper surface of the LCD 34.

The way in which electrical connections are made between the substrate 36 and the LCD 34 (described in more detail below) permits the use of the conductive elastomer 40 in place of a TAB or HSC connection. The elastomer 40 is less labor intensive to install than a TAB or HSC type connection, and, as a secondary affect, can provide some cushioning between the LCD 34 and the substrate 36. Moreover, the present connection also provides for a large degree of tolerance in aligning the conductors on the substrate 36 with pads on the LCD 34, even when the conductor and pads have a relatively small pitch. Consequently, the display assembly 26 is well suited for use in front mount display products that are produced in high volume, such as pagers and the like.

Figure 3:
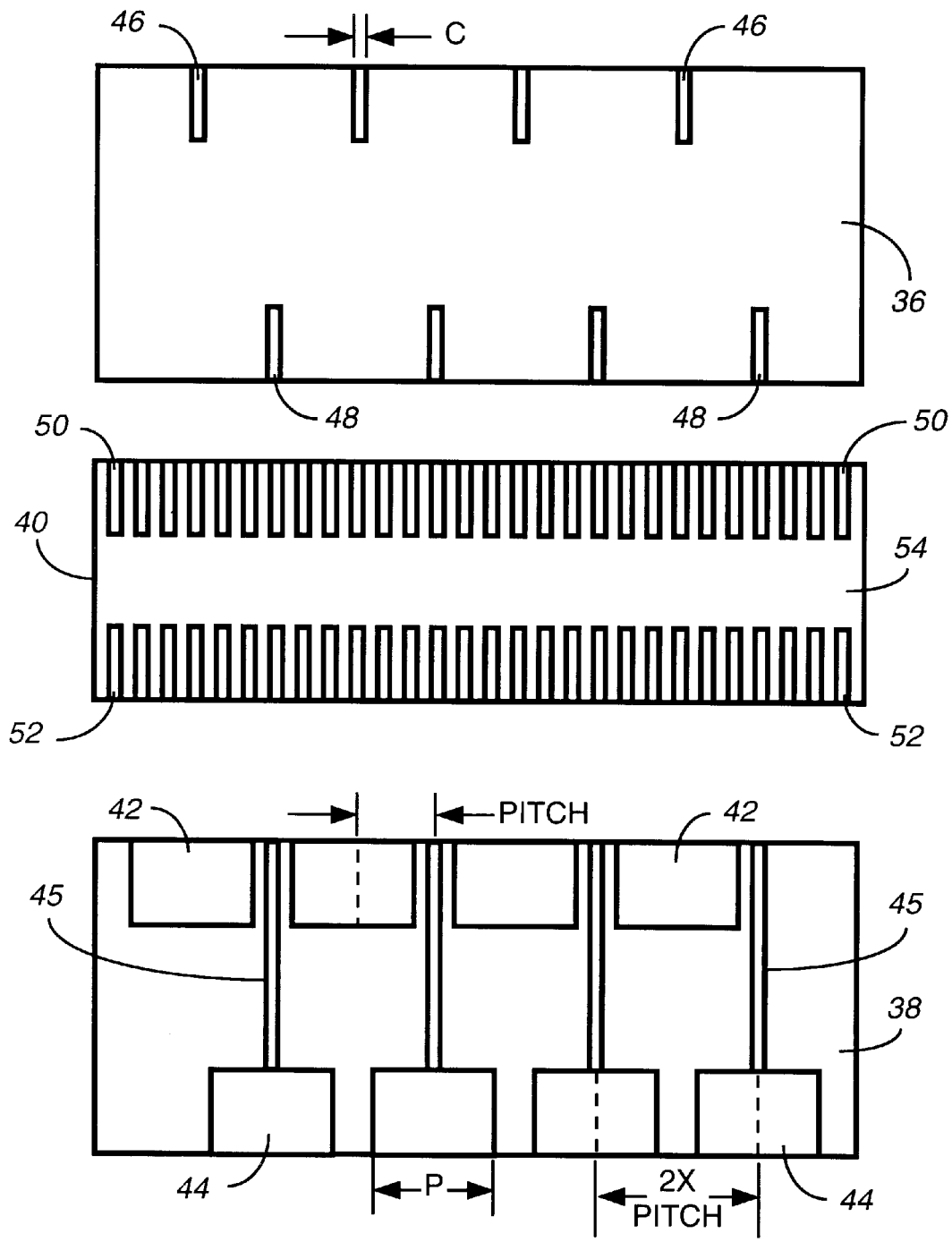
FIG. 3 illustrates a PCB, a conductive elastomer and a bonding shelf having an arrangement of bonding pads thereon, the combination forming a connection according to the invention.

Referring now to FIG. 3, more detail is shown of pads that are formed on the bonding shelf 38, conductors on the substrate 36, and the conductive elastomer 40. A plurality of conductive pads are formed on the illustrated surface of the bonding shelf 38. These pads are arranged as a first row of pads 42 and a second row of pads 44. Preferably, all the pads 42, 44 are of substantially equal size, and the pads 42 in the first row are laterally offset from the pads 44 in the second row. Each pad 44 has a conductive runner 45 that extends between adjacent pads 42 to couple its pad to one or more electrical elements (not shown) in the LCD 34. The pads 42 extend in the direction of the runners 45 to also make connection with other elements. The pads 42, 44 and the runners 45 may be made of indium tin oxide.

Referring to the substrate 36, it carries a plurality of conductors that are arranged to be connected to the pads 42, 44 via the conductive elastomer 40. These conductors are arranged in a first set of conductors 46 that are connected to correspondingly situated pads 42, and a second set of conductors 48 that are connected to pads 44. The conductors 46, 48 are preferably of substantially equal size and, as shown, considerably smaller than the pads 42, 44.

Referring to the conductive elastomer 40, it is of conventional construction, having a first row of conductors 50 and a second row of conductors 52. The conductors 50 and 52, usually made of carbon or conductive wires, extend vertically through the elastomer 40 to its opposite surface. Non-conductive silicone or foam 54 insulates the conductors from each other.

When the connection is fully assembled, the elastomer 40 is situated on the illustrated surface of the bonding shelf 38 such that the row of conductors 50 contacts the row of pads 42, and the row of conductors 52 contacts the row of pads 44.

The substrate 36 is situated atop the illustrated surface of the elastomer 40 such that the row of conductors 46 contacts the conductors 50, and the row of conductors 48 contacts the conductors 52. The conductors 46, 48 are sized such that each of them contacts at least two of the conductors 50, 52 to ensure a reliable electrical connection.

When the connection is assembled as described above, each conductor 46 is electrically connected to a corresponding one of the pads 42 by means of at least two conductors 50. Likewise, each conductor 48 is electrically connected to a corresponding one of the pads 44 by means of at least two conductors 52.

Each of the pads 42, 44 has what is referred to herein as a "pad size". In FIG. 3, the "pad size" dimension is designated by P. Each of the pads 42, 44 has a width or pad size that is substantially equal to P.

The upper limit on the value of P is determined by the relationship: maximum pad size P=2×pitch—2×minimum gap size—minimum trace size. Typically, the minimum gap size is about 5 mils, and the minimum trace size is about 4 mils. With a pitch of 30 mils, this results in a maximum pad size P of about 46 mils.

The conductors 46, 48 have a "conductor size" that corresponds to their width, dimension C in FIG. 3. The minimum conductor size C is limited by the requirement that each conductor 46, 48 contact at least two adjacent conductors 50, 52 in the elastomer 40. Minimum conductor size for conductors 46, 48 is typically about eight mils.

The ratio of pad size to conductor size, P/C, is preferably chosen to be from about 4.0 to 7.5 for the embodiment of FIG. 3. This ratio provides the maximum usable tolerance that is obtainable with the connection described herein. The favorable tolerance provided by the invention will now be discussed with reference to FIGS. 4 and 5.

Figure 4:
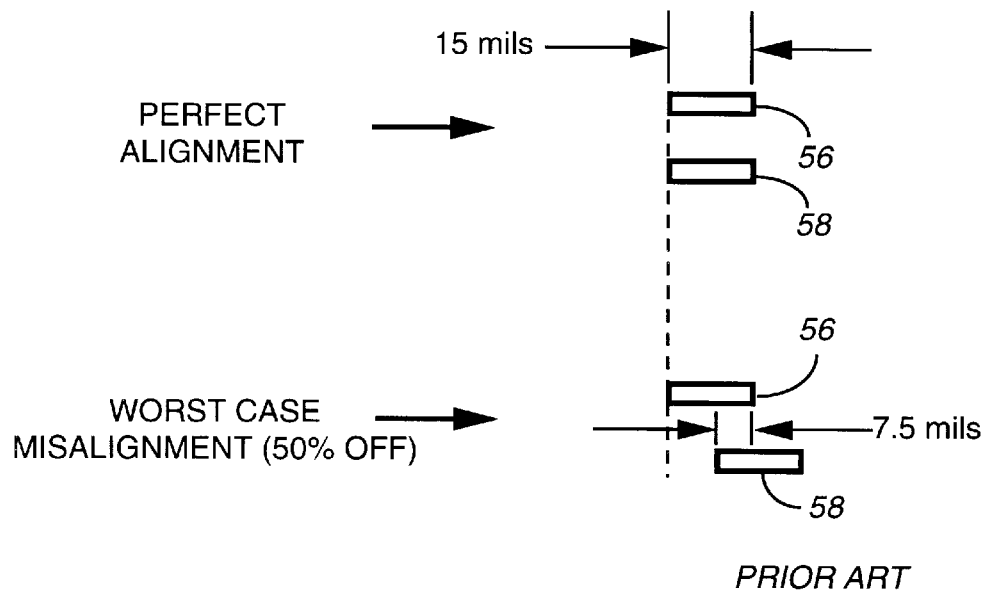
FIGS. 4 and 5 illustrate certain tolerances that are achieved using the present invention as compared to conventional connection techniques.

FIG. 4 shows an edge view of a conventional arrangement in which a PCB conductor 56 is intended to contact a pad 58, where a pitch of 30 mils is used, and both the conductor and the pad have a width of 15 mils.

The conductor 56 and the pad 58 are shown, in one case, as being in perfect alignment with each other; for worst case misalignment (50% off), a tolerance of 7.5 mils results.

Figure 5:
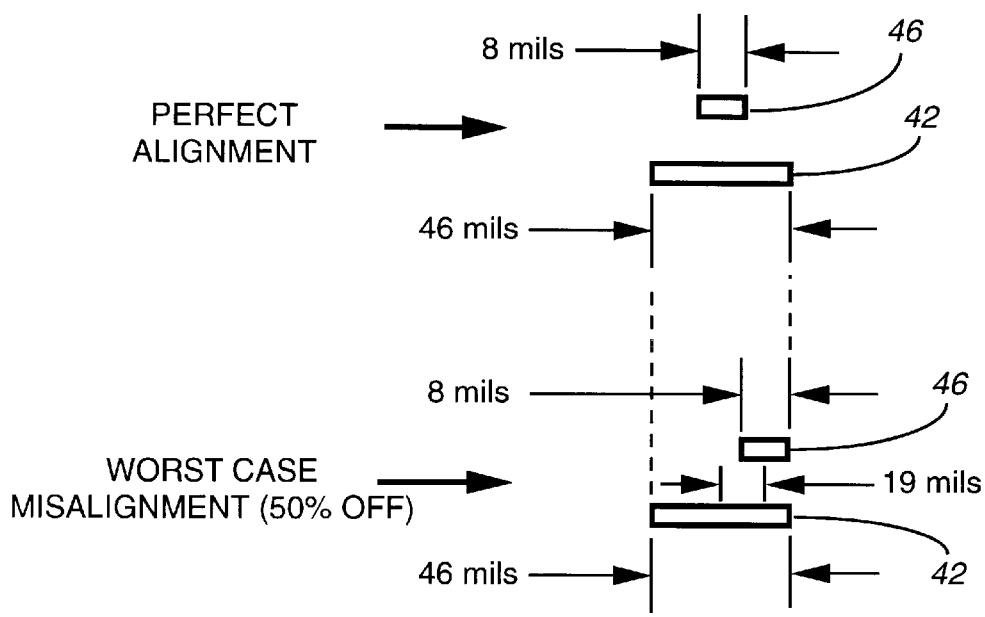

FIG. 5 is an edge view of a conductor 46 and a pad 42 used in FIG. 3. The conductor 46 has a conductor size (width) of 8 mils, and the pad 42 has a pad size of 46 mils. With worst case misalignment, a tolerance of 19 mils is provided. Thus, even if the conductor 46 is 19 mils out of registration with pad 42, acceptable contact between them can occur.

Figure 6:
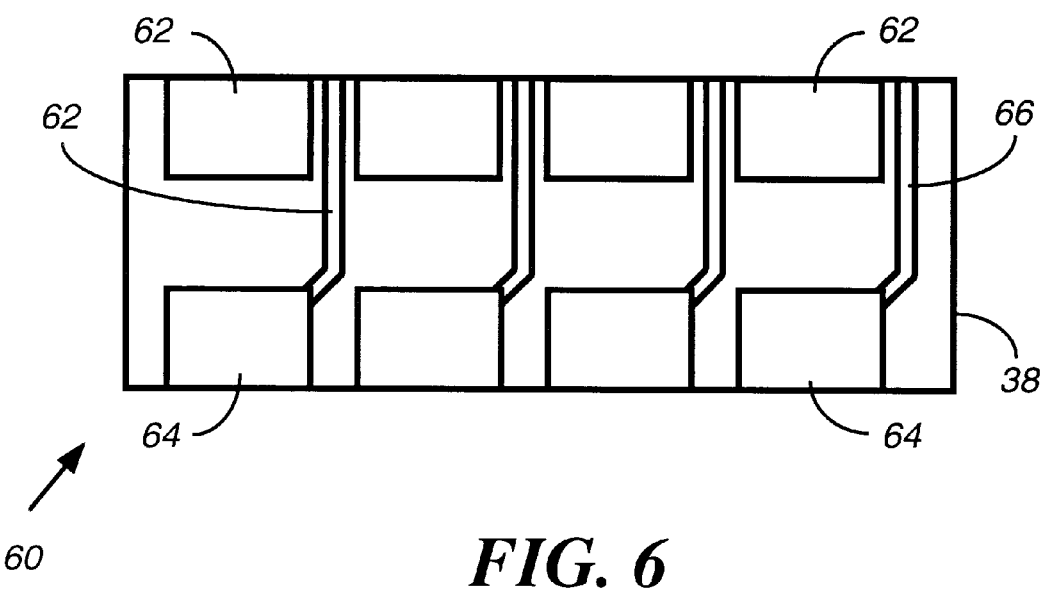
FIG. 6 illustrates an alternate arrangement of bonding pads that is used in accordance with the invention.

Referring to FIG. 6, an alternate embodiment 60 is shown in which pads on the bonding shelf 38 are arranged differently. This embodiment also uses two rows of pads 62, 64, but in this case the pads in one row are in alignment with pads on the other row. Also, each runner 66 extends diagonally away from a corner of its pad 64, and then between adjacent pads 62. This offset in the position of the runners 66 is needed to avoid unwanted contact between the runners 66 and conductors in the elastomer 40.

Figure 1:
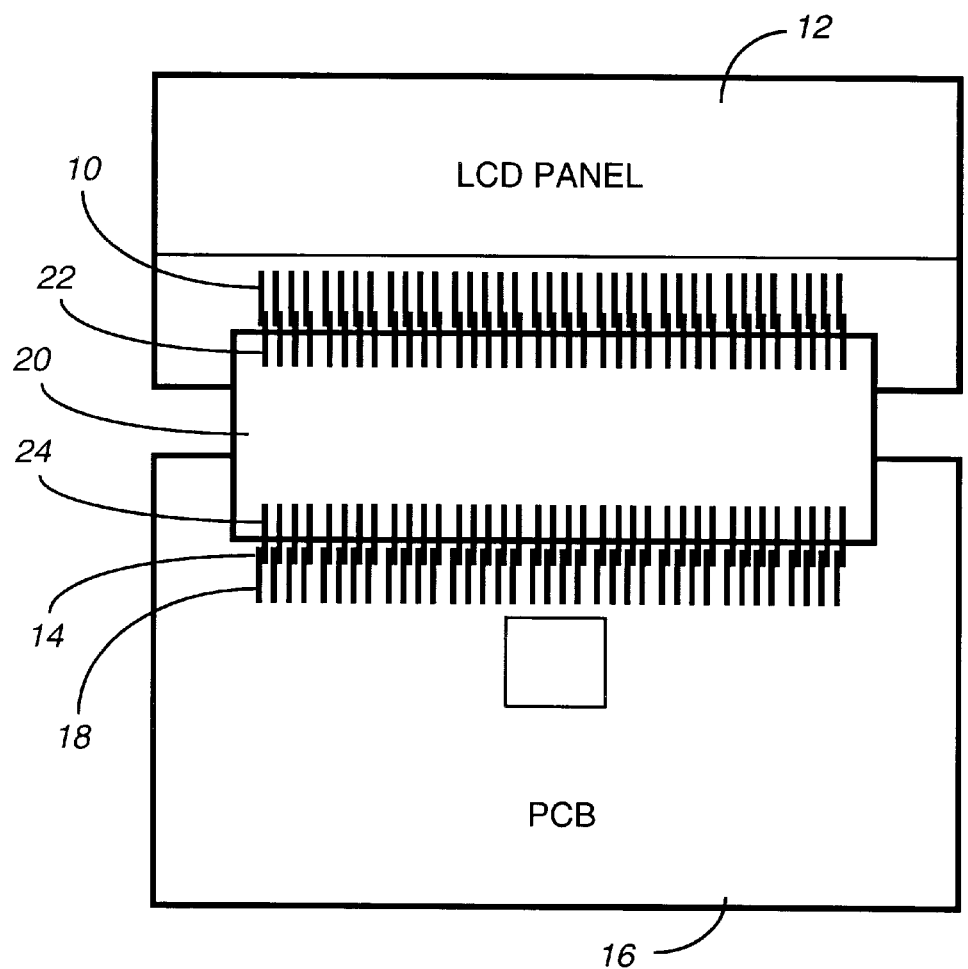
FIG. 1 illustrates a conventional technique for making electrical connections between an electrical component and a substrate.

The use of two rows of pads on the LCD bonding shelf (FIG. 3), along with oversize pads and smaller conductors, effectively doubles the pitch of the present connection as compared to the conventional connection of FIG. 1. Further, tolerances are at least doubled, and no insulating material is needed between the bonding shelf 38 and the PCB 36.

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

I claim:

1. A connection between an electrical component and a substrate for minimizing the affect of misalignment between the electrical component and the substrate, the connection comprising:

a plurality of conductive pads on a surface of the electrical component, the conductive pads being arranged as a first row of pads and a second row of pads, with each conductive pad having a substantially equal pad size;

a plurality of conductors situated on a surface of the substrate, the conductors being arranged as a first set of conductors and a second set of conductors, each conductor having a substantially equal conductor size, and wherein the pad size to conductor size ratio is within a range of about 4.0 to 7.5; and a conductive elastomer situated between the electrical component and the surface of the substrate, the conductive elastomer having a first row of conductors and a second row of conductors, wherein the first row of conductors electrically connects the first set of conductors to the first row of pads, and the second row of conductors electrically connects the second set of conductors to the second row of pads.

2. A connection as set forth in claim 1 wherein the conductive pads in the first row are in alignment with the conductive pads in the second row.

3. A connection as set forth in claim 1 wherein the conductive pads in the first row are laterally offset from the conductive pads in the second row.

4. A connection as set forth in claim 1 wherein the surface of the electrical component comprises a bonding shelf, and wherein the conductive pads are situated on the bonding shelf.

5. A connection as set forth in claim 1 wherein the first row of pads is substantially parallel to the second row of pads.

6. A connection as set forth in claim 5 wherein the first set of conductors is substantially parallel to the second set of conductors.

7. A connection as set forth in claim 6 wherein the first row of conductors is substantially parallel to the second row of conductors.

8. A connection between an electrical component and a substrate for minimizing the affect of misalignment between the electrical component and the substrate, the connection comprising:

a plurality of conductive pads on a surface of the electrical component, the conductive pads being arranged as a first row of pads and a second row of pads, with pads in the second row of pads being laterally offset from pads in the first row of pads;

a plurality of conductors situated on a surface of the substrate the conductors being arranged as a first set of conductors and a second set of conductors; and a conductive elastomer situated between the electrical component and the surface of the substrate, the conductive elastomer having a first row of conductors and a second row of conductors, wherein the first row of conductors electrically connects the first set of conductors to the first row of pads, and the second row of conductors electrically connects the second set of conductors to the second row of pads.

9. A connection as set forth in claim 8 wherein each conductive pad has a substantially equal pad size, wherein each conductor has a substantially equal conductor size, and wherein the pad size to conductor size ratio is within a range of about 4.0 to about 7.5.

10. A connection as set forth in claim 8 wherein the surface of the electrical component comprises a bonding shelf, and wherein the conductive pads are situated on the bonding shelf.

11. A connection as set forth in claim 8 wherein the electrical component comprises a liquid crystal display.

12. A display assembly, comprising:

a liquid crystal display having a bonding shelf;

a plurality of conductive pads on the bonding shelf, the conductive pads being arranged as a first row of pads and a second row of pads, with pads in the second row of pads being laterally offset from pads in the first row of pads;

a substrate;

a plurality of conductors situated on a surface of the substrate, the conductors being arranged as a first set of conductors and a second set of conductors; and a conductive elastomer situated between the bonding shelf and the surface of the substrate, the conductive elastomer having a first row of conductors and a second row of conductors, wherein the first row of conductors electrically connects the first set of conductors to the first row of pads, and the second row of conductors electrically connects the second set of conductors to the second row of pads.

13. A display assembly as set forth in claim 12 wherein each conductive pad has a substantially equal pad size, wherein each conductor has a substantially equal conductor size, and wherein the pad size to conductor size ratio is within a range of about 4.0 to about 7.5.

14. A connection between an electrical component and a substrate for minimizing the affect of misalignment between the electrical component and the substrate, the connection comprising:

a plurality of conductive pads on a surface of the electrical component, the conductive pads being arranged as a first row of pads and a second row of pads, with each conductive pad having a substantially equal pad size, wherein the first row of pads is substantially parallel to the second row of pads;

a plurality of conductors situated on a surface of the substrate, the conductors being arranged as a first set of conductors and a second set of conductors, each conductor having a substantially equal conductor size; and a conductive elastomer situated between the electrical component and the surface of the substrate, the conductive elastomer having a first row of conductors and a second row of conductors, wherein the first row of conductors electrically connects the first set of conductors to the first row of pads, and the second row of conductors electrically connects the second set of conductors to the second row of pads.

\* \* \* \* \*